(12) United States Patent
Mira et al.

(10) Patent No.: US 10,612,862 B2
(45) Date of Patent: Apr. 7, 2020

(54) METHOD OF FORMING A COMBINED VAPOR CHAMBER AND HEAT PIPE ASSEMBLY

(71) Applicant: HEATSCAPE.COM, INC., Morgan Hill, CA (US)

(72) Inventors: Ali Mira, Morgan Hill, CA (US); Yashar Mira, Morgan Hill, CA (US); Michael Mira, Morgan Hill, CA (US)

(73) Assignee: Heatscape.com, Inc., Morgan Hill, CA (US)

( * ) Notice: Subject to any disclaimer, the term of this patent is extended or adjusted under 35 U.S.C. 154(b) by 96 days.

(21) Appl. No.: 15/900,581

(22) Filed: Feb. 20, 2018

(65) Prior Publication Data

US 2019/0128617 A1  May 2, 2019

Related U.S. Application Data

(60) Provisional application No. 62/579,639, filed on Oct. 31, 2017.

(51) Int. Cl.
| F28D 15/02 | (2006.01) |
| H01L 23/427 | (2006.01) |
| F28D 21/00 | (2006.01) |
| H01L 23/367 | (2006.01) |

(52) U.S. Cl.
CPC ..... *F28D 15/0275* (2013.01); *F28D 15/0233* (2013.01); *F28D 2021/0029* (2013.01); *H01L 23/3672* (2013.01); *H01L 23/427* (2013.01)

(58) Field of Classification Search
CPC combination set(s) only.
See application file for complete search history.

(56) References Cited

U.S. PATENT DOCUMENTS

| 6,725,909 B1* | 4/2004 | Luo | F28D 15/04 165/104.21 |
| 10,126,069 B2* | 11/2018 | Sun | F28D 15/04 |
| 2008/0000619 A1* | 1/2008 | Zhou | F28F 1/32 165/80.3 |
| 2017/0227298 A1* | 8/2017 | Sun | F28D 15/04 |

* cited by examiner

*Primary Examiner* — David P Bryant
*Assistant Examiner* — Lawrence Averick
(74) *Attorney, Agent, or Firm* — Kilpatrick Townsend & Stockton LLP

(57) ABSTRACT

Disclosed is a method of forming a combined vapor chamber and heat pipe assembly. A top plate of a vapor chamber may have one or more apertures, through which specially-shaped connectors can be inserted. Each connector may have a collar and flange, with the collar configured to be inserted into an aperture in the top plate. Once inserted, an open end of a heat pipe can be aligned and connected with the protruding portion of the collar. The connector joins the open end of the heat pipe with the top plate, and the heat pipe, connector, and top plate can be joined together to form a single unit. Afterwards, the top plate can be joined with the bottom plate in order to form the characteristic enclosure of a vapor chamber.

20 Claims, 13 Drawing Sheets

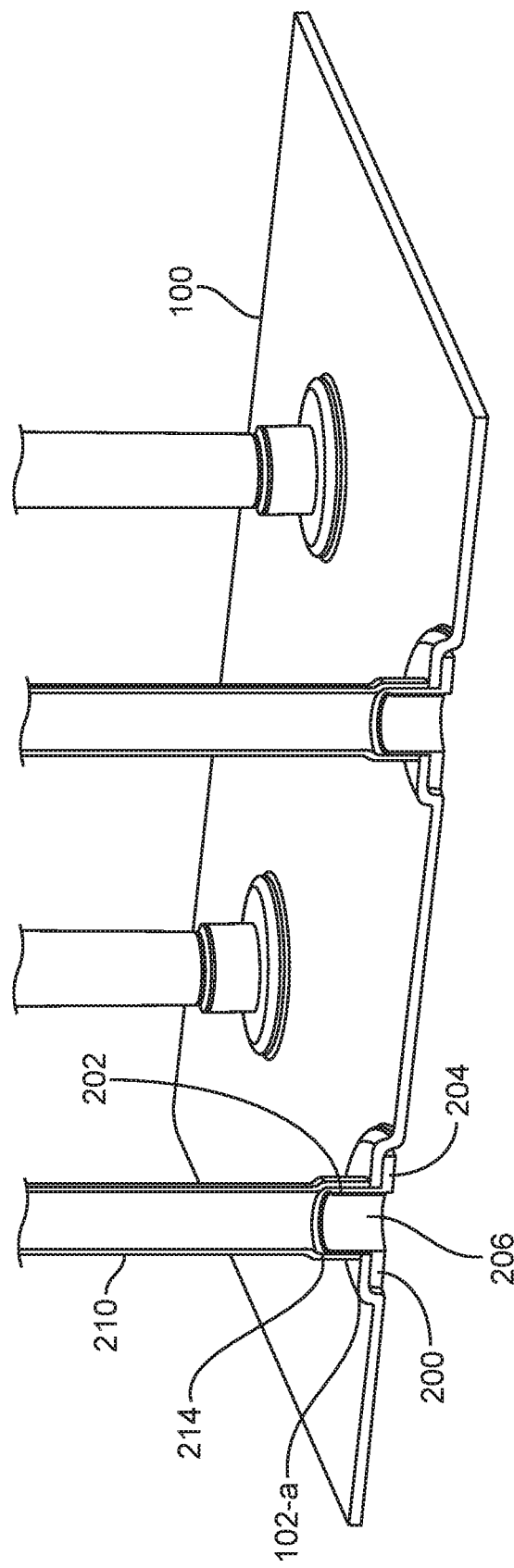

METHOD OF FORMING A COMBINED VAPOR CHAMBER AND HEAT PIPE ASSEMBLY

CROSS-REFERENCES TO RELATED APPLICATIONS

The present application is a non-provisional of and claims the benefit and priority under 35 U.S.C. 119(e) of U.S. Provisional Application No. 62/579,639 filed Oct. 31, 2017, entitled METHOD OF FORMING A COMBINED VAPOR CHAMBER, HEAT PIPE ASSEMBLY, the entire contents of which are incorporated herein by reference for all purposes.

FIELD OF THE INVENTION

The present invention relates to vapor chambers, and more specifically to methods of combining a vapor chamber with a heat pipe into a unitary assembly.

BACKGROUND OF THE INVENTION

Chips (e.g., microchips or integrated circuits) generate heat when used. Central processing units (CPUs) and graphics processing units (GPUs) are two examples of chips that can generate a tremendous amount of heat as a result of performing numerous, extremely high-speed operations required for executing computer programs. That heat needs to be dissipated from the chip in order to allow the chip to operate efficiently. The computer industry is continually innovating cooling systems to address the unique and demanding cooling requirements of chips that produce large amounts of heat.

Heatsinks have been typically used to cool these chips. The heatsink is used to transfer heat away from the chip and towards cooling fins on the heatsink, which provides a large surface area for airflow to efficiently remove the heat from the heatsink through convection, conduction, and radiation (although to a lesser extent). Some heatsinks are used with vapor chambers to improve cooling by taking advantage of the high effective thermal conductivity of vapor chambers.

A vapor chamber is a sealed vessel containing fluid that vaporizes in the vicinity of the hot component. The vapor migrates to a cooler surface of the vapor chamber, where it condenses and returns to the vicinity of the hot component. This vaporization and condensation cycle improves heat transfer from the hot component to the heatsink. Thus, some vapor chamber devices combine the use of vapor chambers with the cooling fins of traditional heatsinks. Vapor chambers are typically used for their high thermal performance. For example, they can be used to dissipate heat from electronic components (e.g., computer chips capable of generating tremendous amounts of heat) by transferring heat away from the electronic component and towards cooling fins on a heatsink. There are many ways in which vapor chambers can be combined with the cooling fins of traditional heatsinks, which can affect the overall thermal performance. There is therefore a need for effective ways to supplement vapor chambers with additional structures (e.g., the cooling fins) that will improve the overall thermal performance.

BRIEF SUMMARY OF THE INVENTION

This disclosure relates to methods of attaching and integrating heat pipes with a vapor chamber in order to form a single assembly. Once integrated, a stack of cooling fins can be coupled to the heat pipes to transfer heat from the heat pipes to the outside ambient. Both the vapor chamber and heat pipes in the assembly serve to transfer heat towards the cooling fins, allowing a low thermal resistance to be achieved.

An embodiment of a method disclosed in the present application for forming a vapor chamber and heat pipe assembly includes inserting a connector into a protrusion aperture of a top plate. The connector includes a collar with a connector aperture traversing from a distal end to a proximal end of the collar, and also a flange attached to the proximal end of the collar, the flange protruding outward perpendicularly from the collar. The top plate has a top surface with a protrusion, and also a bottom surface with a recess corresponding to the protrusion. The protrusion aperture of the top plate traverses through the recess and the protrusion. The method also includes aligning a heat pipe with the collar of the connector after the connector has been inserted into the protrusion aperture. The heat pipe may include a body having an enclosed distal end and an open proximal end that opens into a hollow cavity inside the body. The method also includes connecting the heat pipe to the collar of the connector after the connector has been inserted into the protrusion aperture. The method also includes joining together the heat pipe, connector, and the top plate to form a single unit. The method also includes joining the top plate to a bottom plate to form the vapor chamber and heat pipe assembly having an enclosed space between the top plate and the bottom plate, wherein the enclosed space is in fluid communication with the hollow cavity of the heat pipe via the connector aperture.

In some embodiments, the collar is cylindrically-shaped and the flange is circular. In some embodiments, inserting the connector into the protrusion aperture of the top plate involves inserting the collar of the connector into the protrusion aperture at the bottom surface of the top plate. In some embodiments, connecting the heat pipe to the collar of the connector after the connector has been inserted into the protrusion aperture involves sliding the open proximal end of the heat pipe over an exposed portion of the collar. In some embodiments, the method further includes inserting the distal end of the heat pipe into a fin stack to couple the fin stack around the body of the heat pipe. In some embodiments, the method further includes removing air from the enclosed space via a fill port and adding coolant (e.g., water) into the enclosed space via the fill port. In some embodiments, the flange has a thickness that is less than a depth of the recess. In some embodiments, the protrusion is circularly shaped. In some embodiments, the body of the heat pipe is cylindrical. In some embodiments, the enclosed distal end of the heat pipe is tapered. In some embodiments, the open proximal end of the heat pipe has a diameter roughly equivalent to an outer diameter of the collar. In some embodiments, the method further includes, prior to joining the top plate to the bottom plate, vertically aligning a guide corner of the top plate with a guide corner of the bottom plate. In some embodiments, the connector has a unitary construction. In some embodiments, the connector is made of copper. In some embodiments, the method further includes selecting the connector based on an outer diameter of the collar and a diameter of the protrusion aperture and selecting the heat pipe based on a diameter of the open proximal end of the heat pipe. In some embodiments, joining together the heat pipe, connector, and the top plate to form a single unit includes joining the heat pipe to the collar of the connector and joining the connector to the bottom surface of the top plate. In some embodiments, joining together the heat pipe, connector, and the top plate to form a single unit further includes joining the heat pipe to the top surface of the top plate. In some embodiments, the heat pipe is made of copper. In some embodiments, the connector is made of the same material as the top plate and the bottom plate. In some embodiments, the heat pipe is made of the same material as the top plate and the bottom plate.

These embodiments, and other embodiments, are described below in combination with the images in further detail.

BRIEF DESCRIPTION OF THE DRAWINGS

FIG. 3A illustrates a partial side cutaway view of a top plate of a vapor chamber attached to heat pipes, in accordance with embodiments of the disclosure.

DETAILED DESCRIPTION OF THE INVENTION

One embodiment of the present application is a vapor chamber, which can be formed as an assembly of two vapor chamber forming plates (e.g., a top plate and a bottom plate). The top plate and the bottom plate are coupled together in order to create the enclosed space that is characteristic of a vapor chamber. Within this enclosed space may be one or more connectors, which are configured or selected based on a variety of factors, including: the dimensions of the protrusions in the top plate, the dimensions of the apertures in the top plate, and the dimensions of the heat pipes being coupled to the connectors.

Figure 1A:
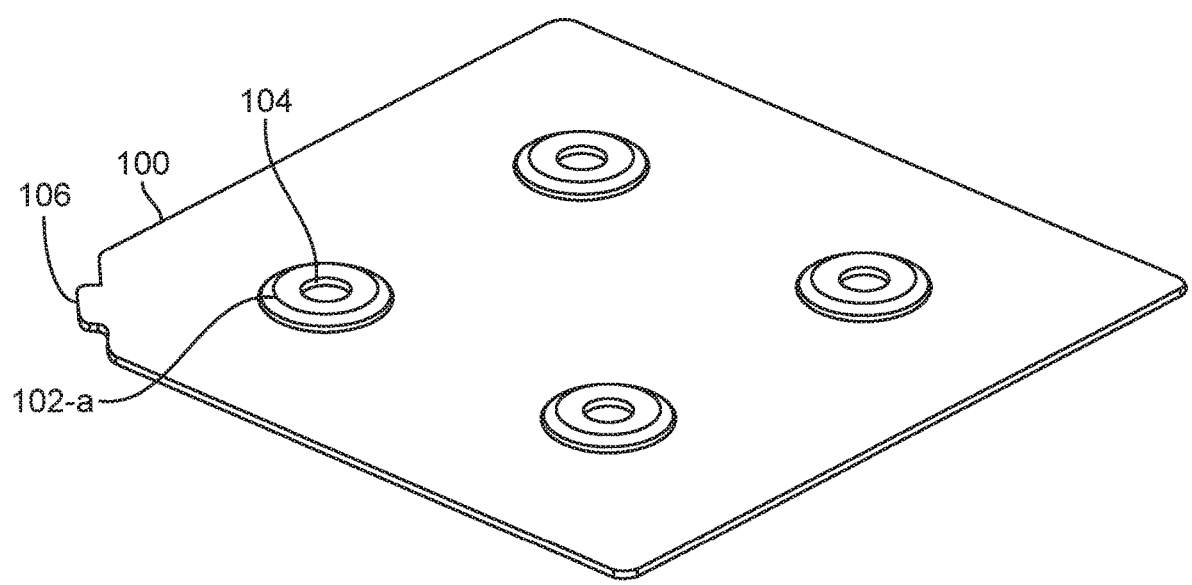
FIG. 1A illustrates a top perspective view of a top plate of a vapor chamber, in accordance with embodiments of the disclosure.
Figure 1B:
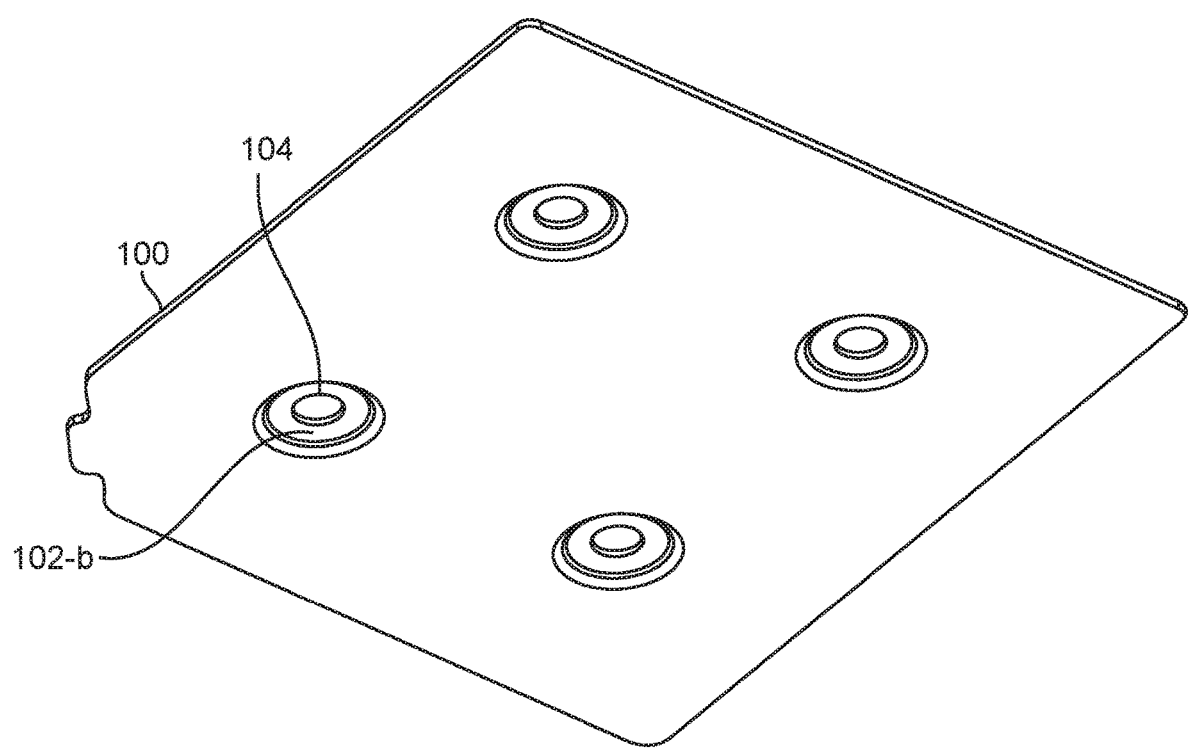
FIG. 1B illustrates a bottom perspective view of a top plate of a vapor chamber, in accordance with embodiments of the disclosure.
Figure 1C:
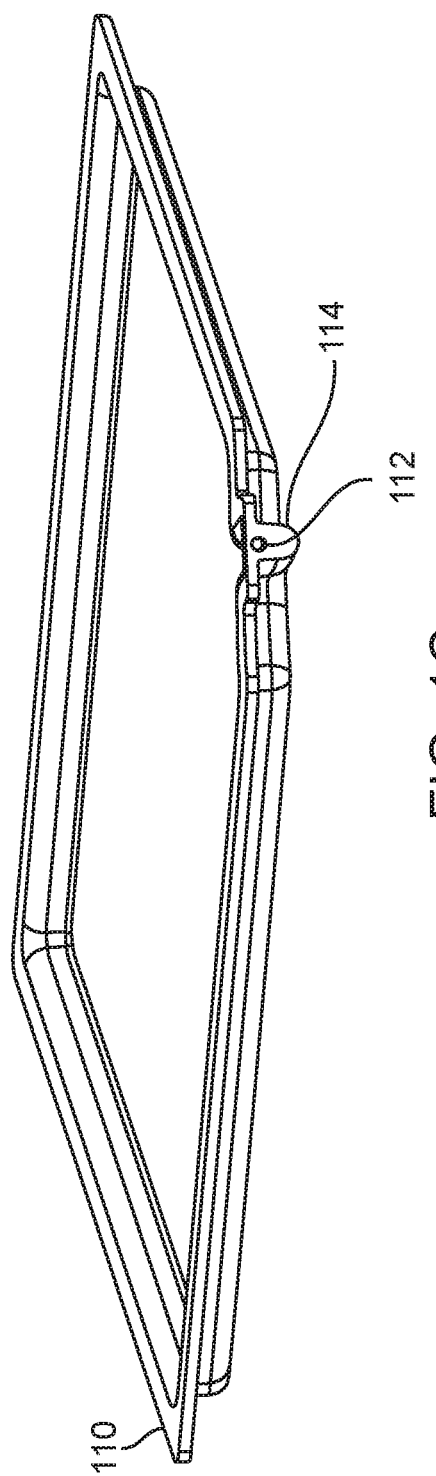
FIG. 1C illustrates a top perspective view of a bottom plate of a vapor chamber, in accordance with embodiments of the disclosure.

FIG. 1A illustrates a top perspective view of a top plate of the vapor chamber. FIG. 1B illustrates a bottom perspective view of a top plate of the vapor chamber. FIG. 1C illustrates a top perspective view of a bottom plate of the vapor chamber. The following description of the top and bottom plates of the vapor chamber is provided in reference to all three sub-figures.

In some embodiments, the vapor chamber may include a top plate 100 and a bottom plate 110. The top plate 100 and the bottom plate 110 may be formed separately, and the assembly of the vapor chamber may include pressing the top plate 100 and the bottom plate 110 together. The top plate 100 and the bottom plate 110 may then be joined together using a variety of methods. For example, brazing is one method to join the various components described herein (e.g., the top plate 100 and the bottom plate 110) so as to form a seamless joint.

In some embodiments, the top plate 100 may have a top surface and a bottom surface. The bottom surface of the top plate 100 may be considered the interior surface that is enclosed once the top plate 100 and the bottom plate 110 are coupled together, while the top surface of the top plate 100 may be considered the exterior surface. In some embodiments, the top plate 100 may have a characteristic thickness, defined in some cases by the thickness of the top plate 100 surrounding the protrusions 102-a (in practice, the top plate 100 may have variations in thickness, such as the thickness of the protrusions 102-a, such that there is no uniform thickness for the top plate 100). The bottom plate 110 may also have a top surface and a bottom surface. The top surface of the bottom plate 110 may be considered the interior surface that is enclosed once the top plate 100 and the bottom plate 110 are coupled together, while the bottom surface of the bottom plate 110 may be considered the exterior surface. In some embodiments, the bottom plate 110 may have a characteristic thickness, defined in some cases by the thickness at the center of the bottom plate 110 (in practice, the bottom plate 110 may have variations in thickness, such as the thickness at the side walls, such that there is no uniform thickness for the bottom plate 110).

The top plate 100 may have one or more protrusions 102-a that extend outwards from the top surface of the top plate 100. These protrusions 102-a correspond to recesses 102-b, which are located on the bottom surface of the top plate 100. In some embodiments, the protrusions 102-a may have a characteristic shape that corresponds to the connectors (not shown) that are placed between the top plate 100 and bottom plate 110. This allows each connector to fit within the recesses 102-b of the protrusions 102-a. For instance, in some embodiments, the protrusions 102-a may be cylindrical or circularly-shaped (as depicted in the figures). This allows a similarly-shaped, circular connector to fit within one of the recesses 102-b, placing the connector between the top plate 100 and the bottom plate 110 once the vapor chamber is assembled. In other embodiments, the protrusions 102-a may have a different shape or configuration, such as a triangular, square, rectangular, or polygonal shape, depending on the corresponding connector shape.

In some embodiments, the protrusions 102-a may have a taper or bevel. As shown in the figures, the generally cylindrical protrusions 102-a have beveled or rounded edges.

In some embodiments, each of the protrusions 102-a may have an aperture 104 (e.g., opening or protrusion aperture).

Each aperture 104 may traverse from the top surface (where the protrusion 102-*a* is located) to the bottom surface of the top plate 100, where the corresponding recess 102-*b* is. The shape and dimensions of the aperture 104 may be selected or configured based on the corresponding shape and dimensions of the connectors, which will become apparent in later figures.

In some embodiments, the top plate 100 and the bottom plate 110 may have to be aligned in a certain way before they can be joined together. For instance, the top plate 100 may have a guide corner 106 that has to be vertically aligned with a guide corner 114 of the bottom plate 110 before the top plate 100 and the bottom plate 110 can be properly joined together. In some embodiments, a fill port 112 may be located at the guide corner 114 of the bottom plate 110. Once the top plate 100 and the bottom plate 110 are joined together to form the vapor chamber, the fill port 112 may be configured to allow air to be extracted out from within the enclosed space of the formed vapor chamber, as well as to permit liquids or vapors to be added into the enclosed space of the formed vapor chamber.

Figure 2A:
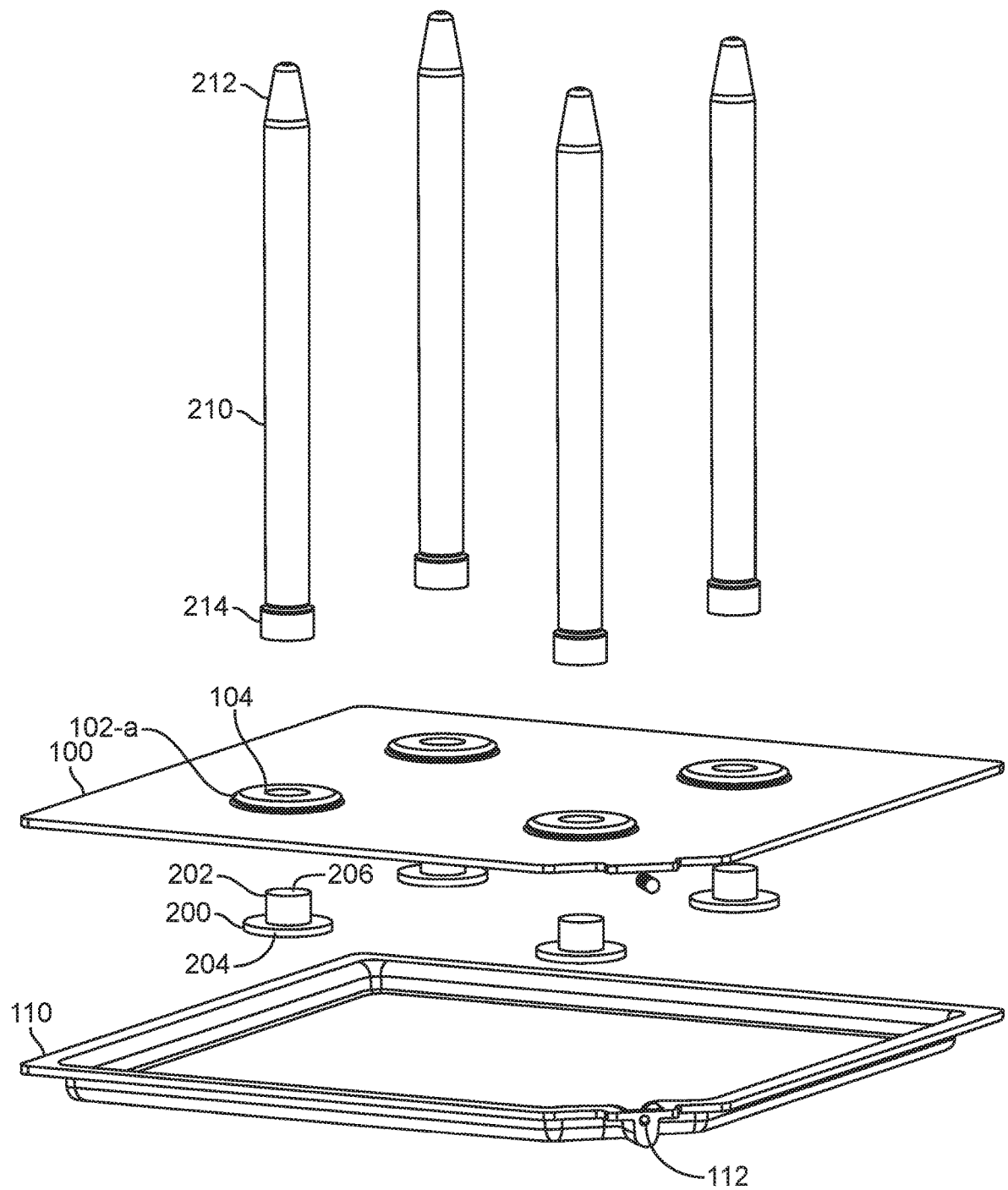
FIG. 2A illustrates a top exploded view of a combined vapor chamber and heat pipe assembly, in accordance with embodiments of the disclosure.
Figure 2B:
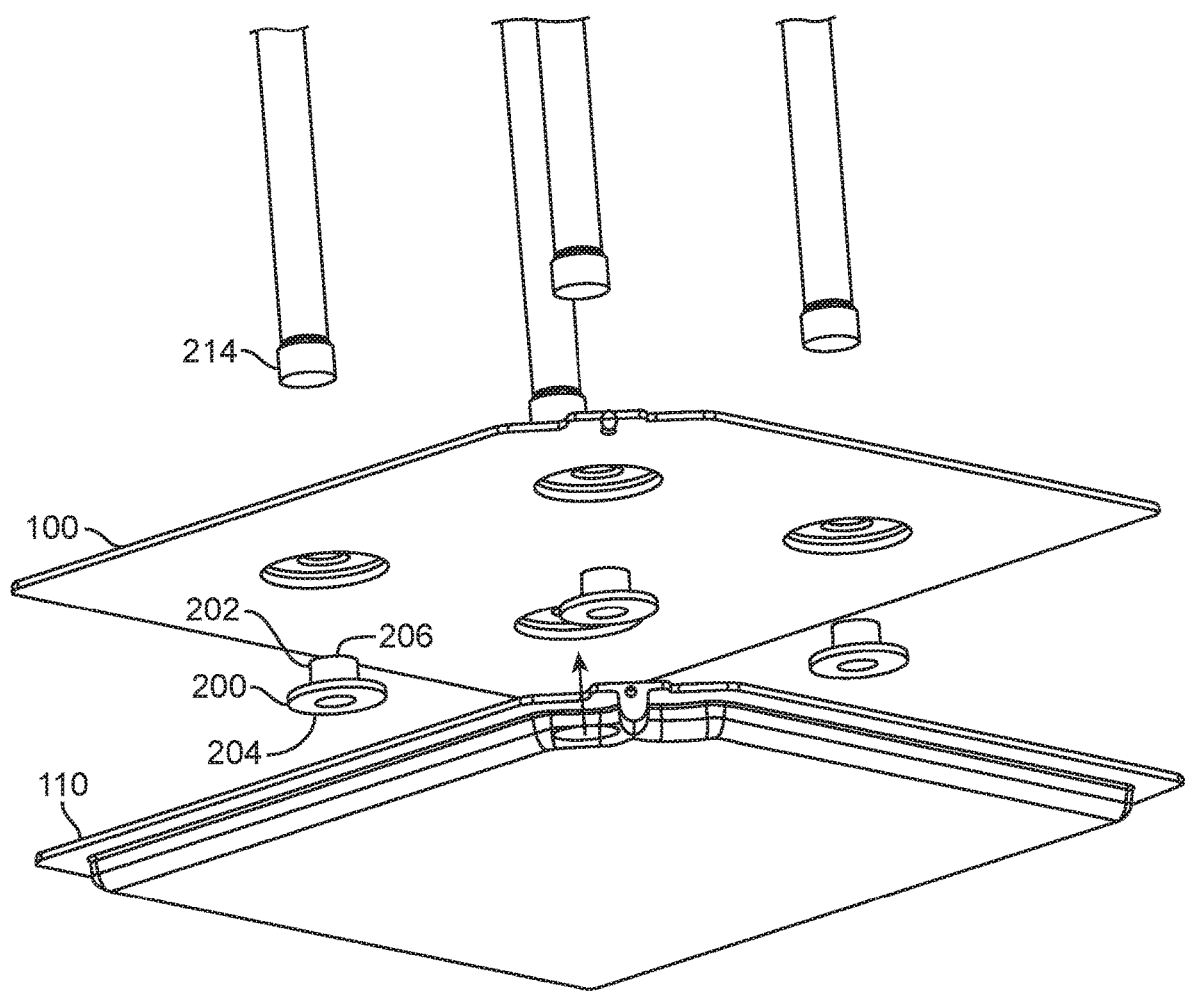
FIG. 2B illustrates a bottom exploded view of a combined vapor chamber and heat pipe assembly, in accordance with embodiments of the disclosure.
Figure 2C:
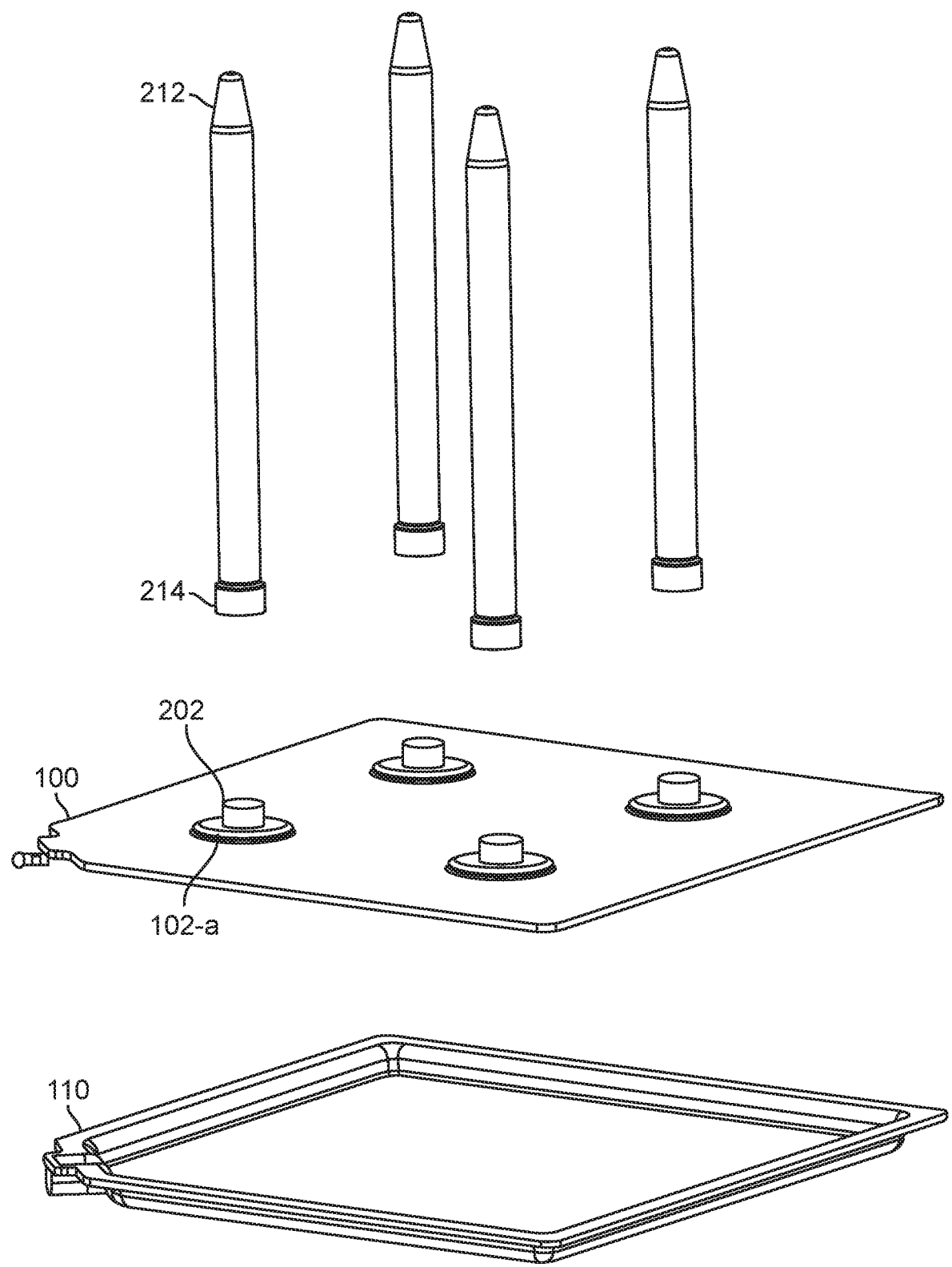
FIG. 2C illustrates a side exploded view of a combined vapor chamber and heat pipe assembly, in accordance with embodiments of the disclosure.

FIG. 2A illustrates a top exploded view of a combined vapor chamber and heat pipe assembly. FIG. 2B illustrates a bottom exploded view of a combined vapor chamber and heat pipe assembly. FIG. 2C illustrates a side exploded view of a combined vapor chamber and heat pipe assembly. The following description of the combined vapor chamber and heat pipe assembly is provided in reference to all three sub-figures.

In some embodiments, one or more connectors 200 may be positioned between the top plate 100 and the bottom plate 110 of the vapor chamber. In some embodiments, each connector 200 may comprise a collar 202 with a flange 204, which is attached to the proximal end of the collar 202 and protrudes outward perpendicularly from the collar 202. In some embodiments, the connector 200 may be of a unitary construction. In some embodiments, the connector 200 may be made of the same material as that of the top plate 100 and/or the bottom plate 110. In some embodiments, the connector 200 may be made of a different material as that of the top plate 100 and/or the bottom plate 110. In some embodiments, the connector 200 may be made of copper.

As depicted in the figures, each collar 202 of the connectors 200 may have a cylindrical shape, although any suitable shape or configuration can be used (e.g., rectangular, triangular, polygonal, and so forth). The shape of the collar 202 may enable the collar 202 to be inserted into similarly-shaped apertures (e.g., protrusion aperture 104) or connect to similarly-shaped shafts (e.g., a circular, open end of a heat pipe 210). The connectors 200 may be referred to as having a top surface (e.g., at the distal end) and a bottom surface (e.g., the bottom of the flange 204 at the proximal end of connector 200).

The flange 204 may have any suitable shape, thickness, or size (e.g., outer radius). However, the shape, thickness, and size of the flange 204 can be selected or configured based on the shape and size of the recesses 102-*b* of the protrusions 102-*a*, which are located on the bottom surface of the top plate 100. For instance, in FIG. 2B, the bottom surface of the top plate 100 is visible and the recesses 102-*b* due to the protrusions 102-*a* can be seen. The thickness and size of the flange 204 on each connector 200 may be smaller than the corresponding dimensions of the recesses 102-*b* in order to allow each connector 200 to be pushed into the recess 102-*b* until the flange 204 is seated within the recess 102-*b*. Since both the flange 204 and the protrusions 102-*a* have a circular shape, the flange 204 only needs to be slightly smaller than the protrusions 102-*a* to be able to fit within the recess 102-*b* of one of the protrusions 102-*a*. Similarly, the thickness of the flange 204 only needs to be less than the depth of the recess 102-*b* in order for the flange 204 to fit fully within the recess 102-*b*.

In some embodiments, the collar 202 may be cylindrical and the attached flange 204 may have a circular shape. This allows the collar 202 to be inserted into circular apertures 104 and the flange 204 to easily fit within circular recesses. In some embodiments, the flange 204 may have a thickness that is equivalent, roughly equivalent (e.g., smaller by a couple millimeters), or smaller than the depth of the recess 102-*b*. This allows the flange 204 to fit fully within the recess 102-*b* once the collar 202 has been fully inserted into an aperture 104. In the cases where the flange 204 has a thickness that is equivalent to the depth of the recess 102-*b*, the bottom surface of the flange 204 may sit flush (e.g., completely level or even) with the bottom surface of the top plate 100 after insertion.

In some embodiments, the collar 202 may have an aperture 206 (e.g., opening or collar aperture) that spans the length of the collar 202 (e.g., from the proximal end to the distal end of the collar 202). The aperture 206 may have any suitable shape. In some embodiments, the aperture 206 may be normal to both the top surface and the bottom surface of the connector 200. In some embodiments, the aperture 206 may be disposed within the center of collar 202 (e.g., the longitudinal axis of the aperture 206 is aligned with the longitudinal axis of the collar 202). As depicted in the figures, in some embodiments, the aperture 206 is cylindrical with a uniform diameter. Since both the collar 202 and the aperture 206 are cylindrical in such embodiments, the collar 202 has an inner radius and an outer radius. The inner radius corresponds to the inner surface (e.g., inner wall) within the collar 202 that is formed by the aperture 206, while the outer radius corresponds to the outer surface (e.g., outer wall) of the collar 202. Thus, the outer radius of the outer surface of the collar 202 will be greater than the inner radius of the inner surface of the collar 202.

In some embodiments, prior to the top plate 100 and the bottom plate 110 of the vapor chamber being coupled together, the collar 202 of each connector 200 can be inserted into one of the apertures 104 (in the top plate 100 of the vapor chamber), from the bottom upwards (e.g., the insertion takes place at the bottom surface of the top plate 100). In some embodiments (e.g., where the aperture 104 are circular and the collar 202 is cylindrically shaped), the aperture 104 may have a diameter that is equivalent, or roughly equivalent (e.g., larger by a couple millimeters), to the outer diameter of the collar 202 such that the collar 202 can be inserted into the aperture 104 with a firm and tight fit.

Once the connector 200 is inserted, if the top plate 100 and the bottom plate 110 of the vapor chamber are coupled together to form the characteristic enclosure of a vapor chamber, each connector 200 will reside within the enclosed space. A certain length of the collar 202 will protrude through the aperture 104. This can be seen in FIG. 2C, which shows the connectors 200 inserted into the apertures 104 in the top plate 100 of the vapor chamber. The protruding portion of the collar 202 can be inserted into the open end (e.g., the proximal end 214) of a heat pipe 210 in order to couple the heat pipe 210 to the vapor chamber.

There may be any number of heat pipes 210, with each heat pipe 210 corresponding to one of the connectors 200. In some embodiments, the heat pipes 210 may be referred collectively to as a collection of vertical heat pipes 210. In some embodiments, such as the one depicted in the figures, there may be four heat pipes 210 in a square arrangement (e.g., the heat pipes 210 are positioned at the four corners of a 'square' on the top plate 100). However, any kind of arrangement for the heat pipes 210 may be suitable. Although the heat pipes 210 are not initially joined together or joined with the vapor chamber, connecting each heat pipe 210 to one of the inserted connectors 200 may internally connect the heat pipes 210 and vapor chamber. This can be better seen in FIG. 3A. In some embodiments, the heat pipes 210 may be made of the same material as that of the top plate 100 and/or the bottom plate 110. In some embodiments, the heat pipes 210 may be made of a different material as that of the top plate 100 and/or the bottom plate 110. In some embodiments, the heat pipes 210 may be made of copper.

Thus, the connectors 200 may serve as connecting hardware for joining together the vapor chamber and heat pipes 210. Accordingly, a method of forming a vapor chamber and heat pipe assembly may include inserting the connectors 200 into the top plate 100. More specifically, the collar 202 of each connector 200 can be inserted from the bottom-up (e.g., at the bottom surface of the top plate 100) into the apertures 104 located in the top plate 100. Once the connectors 200 are fully inserted, an exposed portion of the collar 202 of each connector 200 should protrude past the top surface of the top plate 100. The open proximal end 214 of each of the heat pipes 210 can be aligned with the protruding portion of a corresponding connector 200. Once aligned, the proximal end 214 of the heat pipes 210 can be pushed onto the corresponding connector 200 in order to join the heat pipes 210 to the top plate 100 of the vapor chamber. The vapor chamber and the heat pipes 210 can then be joined together (e.g., they can be brazed to be seamlessly joined together). Which surfaces are joined may vary in different embodiments. For instance, in some embodiments, the connectors 200 may be brazed to the recesses 102-b, and then the heat pipes 210 may then be joined to the exposed end of the connectors 200 that protrude from the top plate 100, which will result in the top plate 100, connectors 200, and the heat pipes 210 being one single unit. Alternatively, in some embodiments, the connectors 200 can be used strictly to align the heat pipes 210 to the top plate 100. Once the heat pipes 210 are connected, the proximal end 214 of each heat pipe 210 can be joined or soldered to the protrusions 102-a on the top plate 100 (e.g., where the heat pipes 210 contact the top plate 100). The connectors 200 can then be removed, leaving the top plate 100 and the heat pipes 210 joined together as one single unit. Thus, the steps of attaching the heat pipes 210 to the top plate 100 may include the steps of inserting, aligning, connecting, and joining.

Once the heat pipes 210 have been seamlessly joined to the top plate 100, the top plate 100 can be joined with the bottom plate 110 by brazing in order to form a combined vapor chamber and heat pipe assembly. The air in the enclosed space within the combined vapor chamber and heat pipe assembly can be removed or evacuated (e.g., via the fill port). In some cases, the air can be vacuumed out through the fill port. In some embodiments, once the combined vapor chamber and heat pipe assembly is formed, any connectors 200 are not outwardly visible since they reside within the assembly.

In some embodiments, a specific amount of contaminant-free water can be added into the enclosed space within the combined vapor chamber and heat pipe assembly (e.g., via the fill port). This water can circulate between the main enclosure of the vapor chamber (e.g., the space between the top plate 100 and the bottom plate 110 when they are joined together) and the space inside the heat pipes 210, as one common volume of vapor/liquid. This feature allows a low thermal resistance to be achieved.

Thus, the connectors 200 may serve as a configurable heat pipe mounting structure. The dimensions of the connectors 200 can be tailored/configured based on the dimensions of the apertures 104 and the heat pipes 210, in order to join together the top plate 100 and the heat pipes 210.

Figure 3B:
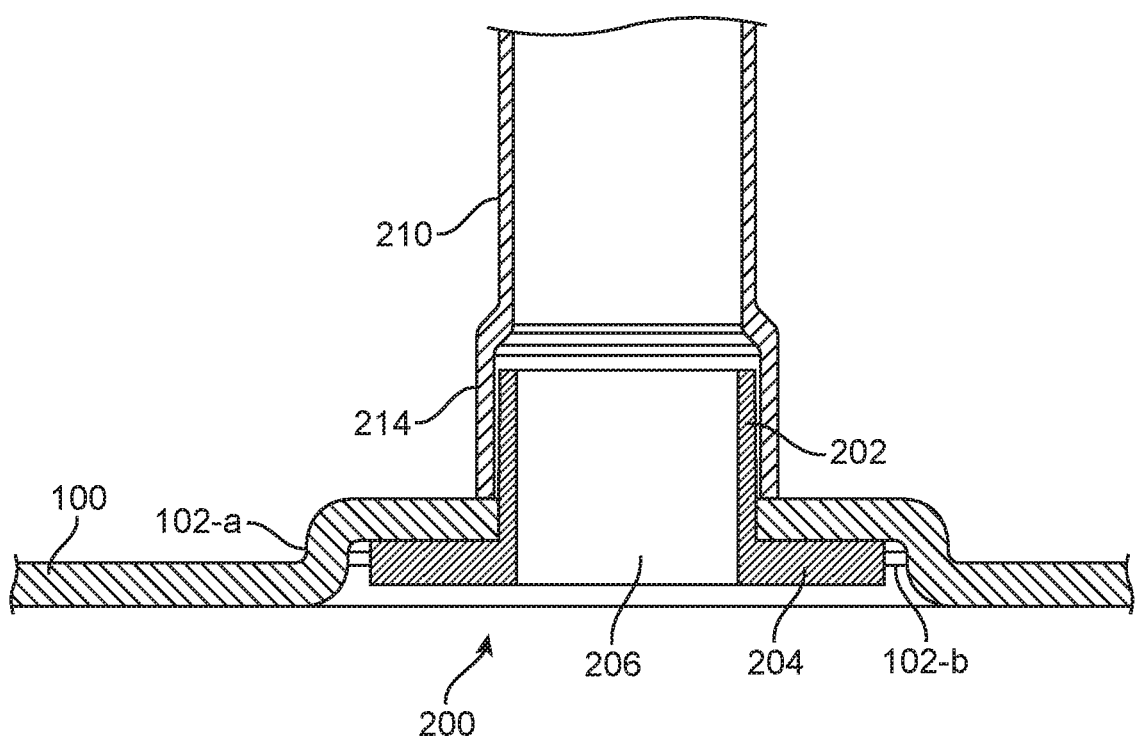
FIG. 3B illustrates a detailed sectional view of the coupling between a top plate of a vapor and a heat pipe, in accordance with embodiments of the disclosure.

FIG. 3A illustrates a partial side cutaway view of a top plate of a vapor chamber attached to heat pipes. FIG. 3B illustrates a detailed sectional view of the coupling between a top plate of a vapor and a heat pipe. The following description of the coupling between the top plate of a vapor chamber and one or more heat pipes is provided in reference to all three sub-figures.

Once a connector 200 is pushed into the recess 102-b of a protrusion 102-a, the portion of the collar 202 which is exposed from the top plate of the vapor chamber can be inserted into the proximal end 214 of a heat pipe 210. In some embodiments, the proximal end 214 of the heat pipe 210 will have a similar shape to the collar 202. The proximal end 214 of the heat pipe 210 may also have slightly larger dimensions than the collar 202 in order to permit the proximal end 214 to slide over the collar 202 and form a tight seal. For instance, both the collar 202 and the proximal end 214 of the heat pipe 210 may be cylindrical, with the proximal end 214 of the heat pipe 210 having an inner radius slightly bigger than the outer radius of the collar 202. This allows the proximal end 214 to be slid over the exposed end of the collar 202, forming a tight seal that couples the heat pipe 210 to the collar 202 (which allows the connector 200 to bridge together the heat pipe 210 and the top plate of the vapor chamber).

In some embodiments, the proximal end 214 of each heat pipe 210 may be slightly enlarged, with a larger radius or diameter than the rest of the heat pipe 210 in order to permit the proximal end 214 to be slid over the collar 202 of a connector 200. In other embodiments, the proximal end 214 and the main body of the heat pipe 210 may both have the same radius or diameter.

In some embodiments, the heat pipe 210 may be mostly hollow, with a hollow cavity or an aperture that spans the length of the heat pipe 210. Once the heat pipe 210 is coupled to the collar 202, the hollow cavity or aperture of the heat pipe 210 will be in fluid communication with the aperture 206 in the collar 202, which in turn opens up into the enclosed space within the fully-assembled vapor chamber. Thus, the inside of the heat pipe 210 will be in fluid communication with the enclosed space of the vapor chamber.

In FIG. 3B, it can be seen that once the collar 202 of the connector 200 has been fully inserted through the top plate 100, the flange 204 of the connector 200 resides fully within the recess of a protrusion. In the figure, the flange 204 has a thickness which is less than the depth of the recess. However, if the flange 204 has a thickness equivalent to the depth of the recess, the bottom surface of the flange 204 will lie flush against the bottom surface of the top plate 100.

Figure 4A:
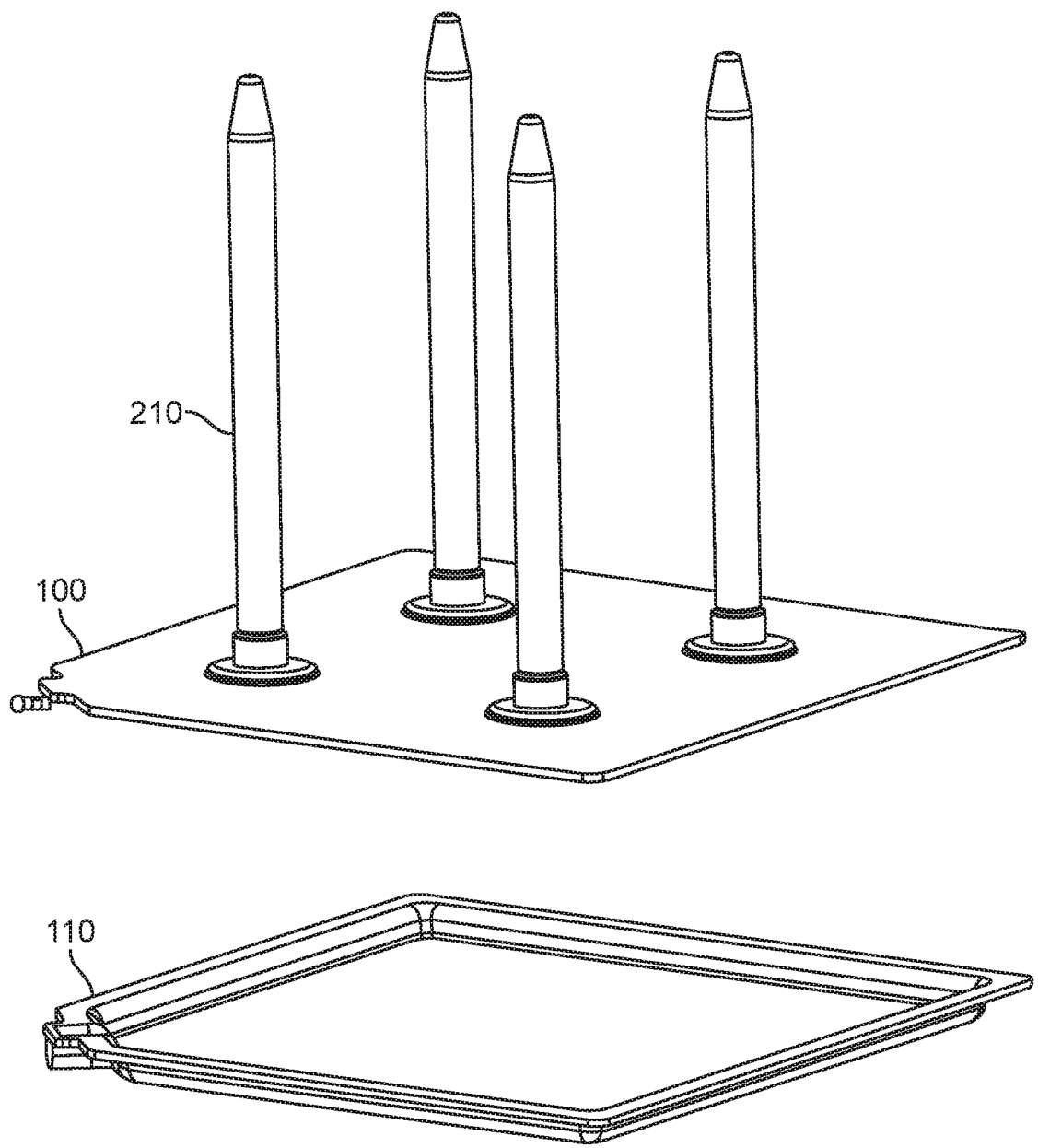
FIG. 4A illustrates a top perspective view of a combined vapor chamber and heat pipe assembly, in accordance with embodiments of the disclosure.
Figure 4B:
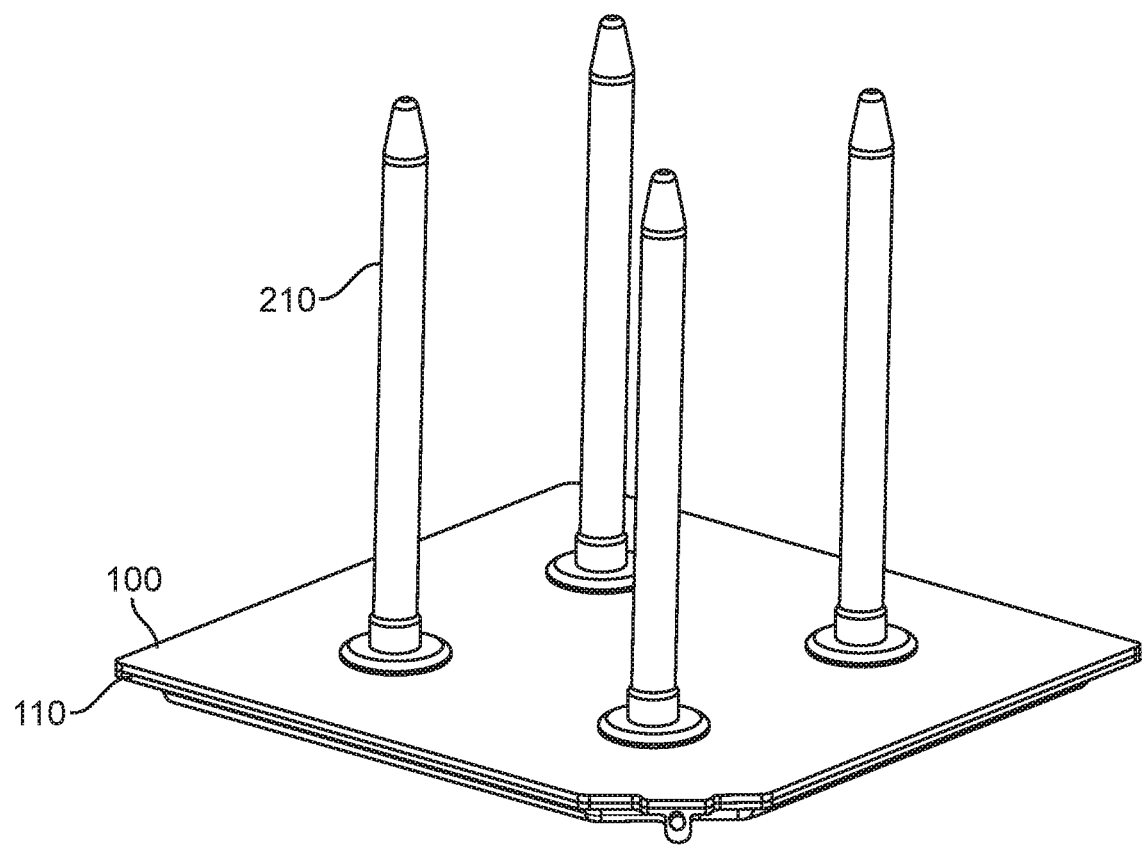
FIG. 4B illustrates a top perspective view of a combined vapor chamber and heat pipe assembly, in accordance with embodiments of the disclosure.
Figure 4C:
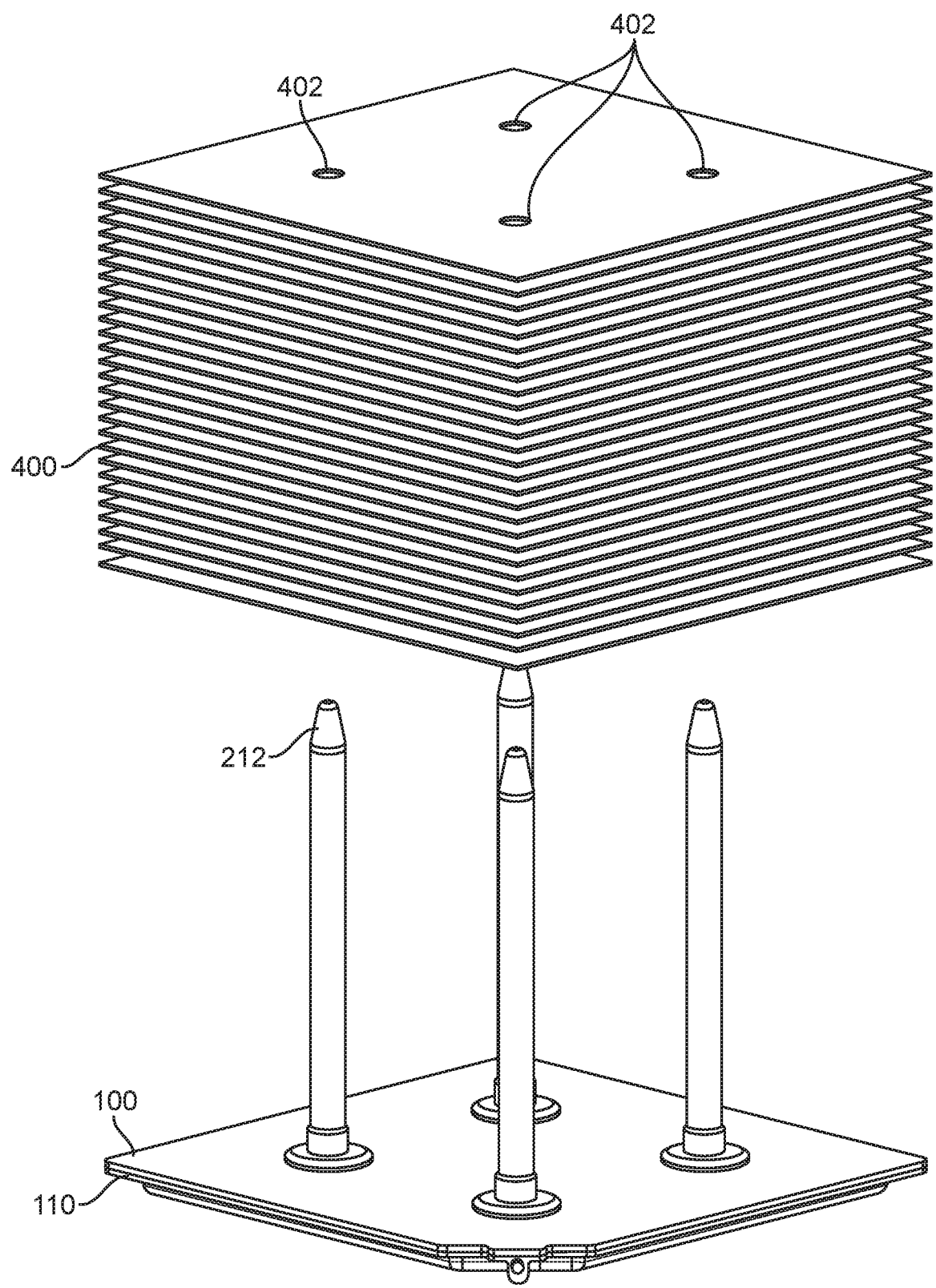
FIG. 4C illustrates a top perspective view of a combined vapor chamber and heat pipe assembly with a fin stack, in accordance with embodiments of the disclosure.

FIG. 4A illustrates a top perspective view of a combined vapor chamber and heat pipe assembly. FIG. 4B illustrates a top perspective view of a combined vapor chamber and heat pipe assembly. FIG. 4C illustrates a top perspective view of a combined vapor chamber and heat pipe assembly with a fin stack. The following description of the combined vapor chamber and heat pipe assembly is provided in reference to all three sub-figures.

As previously described, one or more heat pipes 210 may be attached to the top plate 100 of the vapor chamber. In FIGS. 4A-4C, there are four heat pipes 210 attached to the top plate 100 of the vapor chamber. Any number of heat pipes 210 may be used depending on the size of the vapor chamber and size/configuration of the fin stack being coupled to the assembly.

In FIG. 4C, a cooling fin stack 400 is shown along with the combined vapor chamber and heat pipe assembly. In some embodiments, the fin stack 400 may have a set of apertures 402 (e.g., openings or fin apertures) that are sized and shaped similarly to the cross-section of the heat pipes 210. For instance, the body of the heat pipes 210 may have a cylindrical cross section with a specific diameter. The apertures 402 may have a similar, or slightly greater (e.g., up to a couple millimeters greater) diameter in order to permit the heat pipes 210 to be inserted through the apertures 402. Once the heat pipes 210 are inserted into the set of apertures 402 in order to seat the fin stack 400 on top of the vapor chamber, the fin stack 400 is coupled to the heat pipes 210, which conducts heat from the heat pipes 210 to the outside ambient.

Figure 5A:
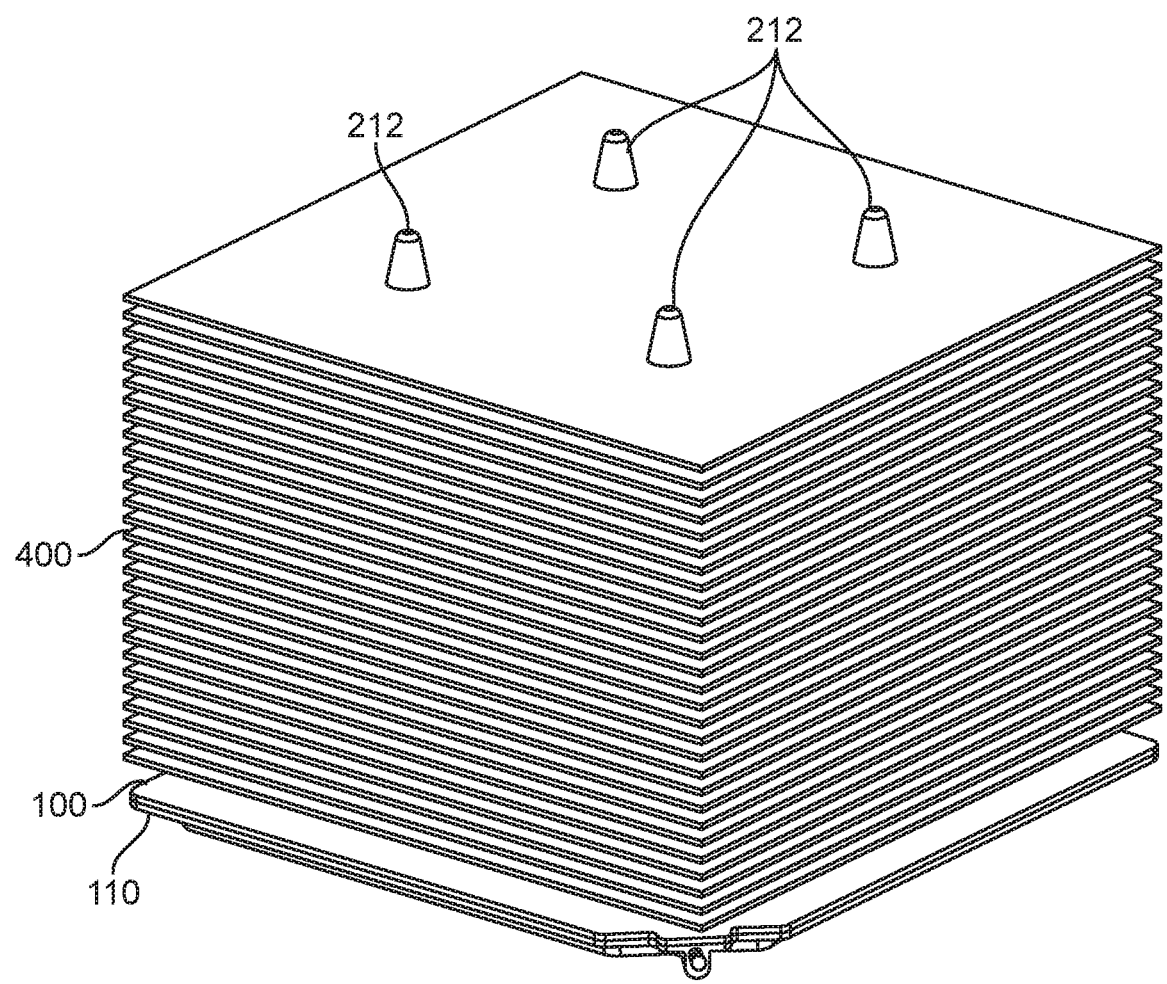
FIG. 5A illustrates a top perspective view of a combined vapor chamber and heat pipe assembly coupled to a fin stack, in accordance with embodiments of the disclosure.
Figure 5B:
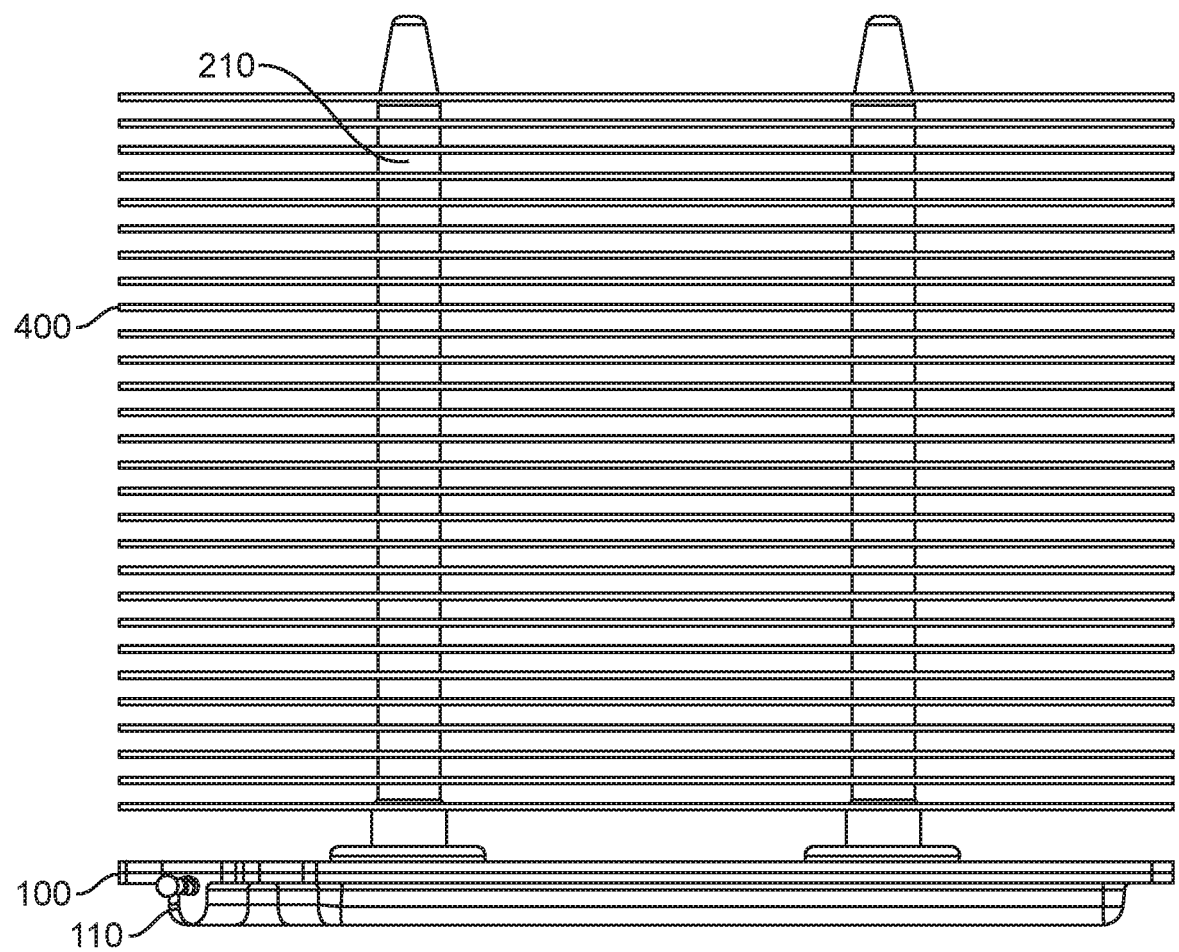
FIG. 5B illustrates a side view of a combined vapor chamber and heat pipe assembly coupled to a fin stack, in accordance with embodiments of the disclosure.

FIG. 5A illustrates a top perspective view of a combined vapor chamber and heat pipe assembly coupled to a fin stack. FIG. 5B illustrates a side view of a combined vapor chamber and heat pipe assembly coupled to a fin stack. The following description of the combined vapor chamber and heat pipe assembly coupled to a fin stack is provided in reference to both sub-figures.

Once the fin stack 400 has been seated on top of the vapor chamber, the distal end 212 of the heat pipes 210 protrude past the fin stack 400. In some embodiments, the distal end 212 of the heat pipes 210 is conical or tapered, such as the figures depict. In some embodiments, the distal end 212 of the heat pipes 210 may be flat. In some embodiments, the distal end 212 of the heat pipes 210 does not protrude past the fin stack 400 or only protrudes past the fin stack 400 slightly. There may be any number of fins in the fin stack 400. As shown in the figures, the fin stack 400 has 28 fins that are spaced apart at equal distances.

In some embodiments, the vapor chamber and heat pipe assembly can be manufactured or assembled by first determining the dimensions of one of the pieces (e.g., of the fin stack, the heat pipes, the connectors, or the top/bottom plate of the vapor chamber) and then selecting or configuring the other pieces in the assembly based off those dimensions. For instance, the diameters of apertures in a top plate can be first determined. The depth of recesses in the top plate can also be considered. With that information, a number of connectors (equivalent to the number of apertures in the top plate) may be selected with collars that can fit within those apertures. Accordingly, the diameter of the collars will have a similar diameter to the diameter of the apertures. The collars of the connectors can be inserted into the apertures in the top plate, and an exposed portion of each collar will protrude outward from the top surface of the top plate. Heat pipes can be selected that will fit on the exposed portion of the collars (e.g., at one end, the heat pipes will have an opening of similar diameter to the outer diameter of the collars). In addition, a fin stack with apertures that the heat pipes can be inserted through can be selected. In some embodiments, the various pieces in the assembly can be manufactured with desired dimensions known in advance.

Terminology

The terms "approximately", "about", and "substantially" as used herein represent an amount close to the stated amount that still performs a desired function or achieves a desired result. For example, the terms "approximately", "about", and "substantially" may refer to an amount that is within less than 10% of, within less than 5% of, within less than 1% of, within less than 0.1% of, and within less than 0.01% of the stated amount.

Although this invention has been disclosed in the context of certain preferred embodiments and examples, it will be understood by those skilled in the art that the present invention extends beyond the specifically disclosed embodiments to other alternative embodiments and/or uses of the invention and obvious modifications and equivalents thereof. In addition, while a number of variations of the invention have been shown and described in detail, other modifications, which are within the scope of this invention, will be readily apparent to those of skill in the art based upon this disclosure. It is also contemplated that various combinations or sub-combinations of the specific features and aspects of the embodiments may be made and still fall within the scope of the invention. Accordingly, it should be understood that various features and aspects of the disclosed embodiments can be combined with or substituted for one another in order to form varying modes of the disclosed invention. Thus, it is intended that the scope of the present invention herein disclosed should not be limited by the particular disclosed embodiments described above.

Similarly, this method of disclosure is not to be interpreted as reflecting an intention that any claim require more features than are expressly recited in that claim. Rather, inventive aspects may lie in a combination of fewer than all features of any single foregoing disclosed embodiment. Thus, the claims following the Detailed Description are hereby expressly incorporated into this Detailed Description, with each claim standing on its own as a separate embodiment.

What is claimed is:

1. A method of forming a vapor chamber and heat pipe assembly, comprising:

inserting a connector through a protrusion aperture of a top plate, wherein the connector comprises:

a collar defining a connector aperture extending through the collar; and a flange surrounding and extending perpendicularly from a first end of the collar, and wherein the top plate comprises:

a top flat surface comprising a protrusion; and a bottom surface comprising a recess corresponding to the protrusion, wherein the protrusion aperture extends through the top plate from the recess to the protrusion, and wherein the connector is inserted through the protrusion aperture so that the flange is positioned within the recess with the collar extending through the protrusion aperture with a second end of the collar opposite the first end positioned on a side of the top plate opposite the recess;

inserting the second end of the collar extending through the protrusion aperture into a hollow cavity of a heat pipe, wherein the heat pipe comprises:

a body comprising an enclosed distal end and an open proximal end opening into the hollow cavity defined by the body;

coupling the heat pipe to at least one of the connector and the top plate to form a single unit; and coupling the single unit to a bottom plate to form the vapor chamber and heat pipe assembly having an enclosed space between the top plate and the bottom plate, wherein the enclosed space is in fluid communication with the hollow cavity of the heat pipe.

2. The method of claim 1, wherein the collar is cylindrically-shaped and the flange is disc-shaped, and wherein the protrusion and corresponding recesses are circular so that the disc-shaped flange is positioned within the recess in the vapor chamber and heat pipe assembly.

3. The method of claim 2, wherein the body of the heat pipe is cylindrical.

4. The method of claim 2, wherein the enclosed distal end of the heat pipe is tapered.

5. The method of claim 1,
wherein inserting the connector into the protrusion aperture of the top plate comprises inserting the second end of the collar into the recess and then through the protrusion aperture at the bottom surface of the top plate.

6. The method of claim 1, wherein the method further comprises:
inserting the distal end of the heat pipe into a fin stack to couple the fin stack around the body of the heat pipe.

7. The method of claim 1, wherein the method further comprises:
removing air from the enclosed space via a fill port; and
adding coolant into the enclosed space via the fill port.

8. The method of claim 1, wherein the flange defines a thickness that is less than a depth of the recess, and wherein the method further comprising brazing or soldering the flange to interior surfaces of the recess.

9. The method of claim 1, wherein the open proximal end of the heat pipe defines a diameter equal to an outer diameter of the collar.

10. The method of claim 1, wherein the method further comprises:
prior to coupling the single unit to the bottom plate, vertically aligning a guide corner of the top plate with a guide corner of the bottom plate.

11. The method of claim 1, wherein the connector comprises a unitary construction.

12. The method of claim 1, wherein the connector is made of copper.

13. The method of claim 1, wherein coupling the heat pipe to at least one of the connector and the top plate to form the single unit comprises:
soldering or brazing the heat pipe to the collar of the connector; and
soldering or brazing the connector to the bottom surface of the top plate.

14. The method of claim 1, wherein coupling the heat pipe to at least one of the connector and the top plate to form the single unit further comprises:
soldering or brazing the heat pipe to the top surface of the top plate.

15. The method of claim 1, wherein the heat pipe is made of copper.

16. The method of claim 1, wherein the connector is made of the same material as the top plate and the bottom plate.

17. The method of claim 1, wherein the heat pipe is made of the same material as the top plate and the bottom plate.

18. The method of claim 1, wherein coupling the heat pipe to at least one of the connector and the top plate to form the single unit comprises coupling the heat pipe to the top plate; and
wherein prior to coupling the single unit to the bottom plate to form the vapor chamber and heat pipe assembly, the connector is removed from the protrusion aperture so that the connector is not present within the enclosed space.

19. A method of forming a vapor chamber and heat pipe assembly, comprising:
inserting a connector through a protrusion aperture of a top plate,
wherein the connector comprises:
a collar defining a connector aperture extending through the collar; and
a flange surrounding and extending perpendicularly from a first end of the collar, and
wherein the top plate comprises:
a flat top surface comprising a protrusion; and
a bottom surface comprising a recess corresponding to the protrusion,
wherein the protrusion aperture extends through the top plate from the recess to the protrusion, and
wherein the connector is inserted through the protrusion aperture so that the flange is positioned within the recess with the collar extending through the protrusion aperture with a second end of the collar opposite the first end positioned on a side of the top plate opposite the recess;
inserting the second end of the collar extending through the protrusion aperture into a hollow cavity of a heat pipe, wherein the heat pipe comprises:
a body comprising an enclosed distal end and an open proximal end opening into the hollow cavity defined by the body;
coupling the heat pipe to the top plate to form a single unit,
wherein the second end of the collar is within the hollow cavity of the heat pipe during the coupling of the heat pipe to the top plate;
removing the second end of the coupling from the hollow cavity of the heat pipe after the single unit is formed;
coupling the single unit to a bottom plate to form the vapor chamber and heat pipe assembly having an enclosed space between the top plate and the bottom plate,
wherein the enclosed space is in fluid communication with the hollow cavity of the heat pipe and does not contain the connector.

20. A vapor chamber and heat pipe assembly, comprising:
a connector comprising a collar defining a connector aperture extending through the collar and a flange surrounding and extending perpendicularly from a first end of the collar;
a top plate comprising a flat top surface and a bottom surface,
where the top surface comprises a protrusion,
wherein the bottom surface comprise a recess corresponding to the protrusion, and
wherein a protrusion aperture extends through the top plate from the recess to the protrusion;
a heat pipe comprising a body,
an enclosed distal end and an open proximal end opening into a hollow cavity defined by the body; and
a bottom plate;
wherein the flange is positioned within the recess with the collar extending through the protrusion aperture with a second end of the collar opposite the first end and positioned on a side of the top plate opposite the recess;
wherein the heat pipe is brazed or soldered to at least one of the connector and the top plate, and wherein the bottom plate is coupled to the top plate forming a vapor chamber and heat pipe assembly defining an enclosed space between the top plate and the bottom plate,
wherein the enclosed space is in fluid communication with the hollow cavity of the heat pipe.

* * * * *